(12) United States Patent
Simony

(10) Patent No.: US 7,098,838 B2
(45) Date of Patent: Aug. 29, 2006

(54) AMPLIFIED ANALOG INFORMATION READING DEVICE WITH LINEAR DB MODE GAIN CONTROL, IN PARTICULAR FOR AN IMAGE SENSOR

(75) Inventor: Laurent Simony, Grenoble (FR)

(73) Assignee: STMicroelectronics SA, Montrouge (FR)

(*) Notice: Subject to any disclaimer, the term of this patent is extended or adjusted under 35 U.S.C. 154(b) by 0 days.

(21) Appl. No.: 11/191,614

(22) Filed: Jul. 28, 2005

(65) Prior Publication Data

US 2006/0071842 A1    Apr. 6, 2006

(30) Foreign Application Priority Data

Jul. 29, 2004    (FR) .................... 04 08357

(51) Int. Cl.
   *H03M 1/12*    (2006.01)
(52) U.S. Cl. ........................ 341/155; 341/170
(58) Field of Classification Search ............ 341/155, 341/170, 144
   See application file for complete search history.

(56) References Cited

U.S. PATENT DOCUMENTS

| | | | |
|---|---|---|---|
| 4,041,443 A | * | 8/1977 | Thigpen ..................... 367/45 |
| 4,275,413 A | * | 6/1981 | Sakamoto et al. ......... 358/525 |
| 5,343,201 A | * | 8/1994 | Takayama et al. ......... 341/200 |
| 6,556,163 B1 | * | 4/2003 | Hwang et al. .............. 341/155 |
| 2002/0105449 A1 | | 8/2002 | Schreier et al. ........... 341/139 |

FOREIGN PATENT DOCUMENTS

| JP | 61163721 | 7/1986 |
|---|---|---|
| JP | 11069242 | 3/1999 |

\* cited by examiner

*Primary Examiner*—Peguy JeanPierre
(74) *Attorney, Agent, or Firm*—Lisa K. Jorgenson; Jose Gutman; Fleit, Kain, Gibbons, Gutman, Bongini & Bianco P.L.

(57) ABSTRACT

An amplified reading device includes an adjustable gain amplifier AMP receiving analog information and of which $2^j$ successive gain values, respectively adjustable by $2^j$ successive values of a first control word of j bits, follow a geometric progression of ratio a; an analog/digital converter CAN connected to the output of the amplifier, having an adjustable input full scale, of which $2^k$ different values, respectively adjustable, for each gain value, from $2^k$ successive values of a second control word of k bits, follow a geometric progression of ratio $a^{1/2^k}$, the converter delivering a digital code corresponding to the analog information amplified by an overall gain, the value of which depends on the gain value of the amplifier and on that of the full scale, and a controller MCM designed to deliver the first and second control words.

18 Claims, 5 Drawing Sheets

FIG.3

| rough gain | fine gain | total gain |
|:---:|:---:|:---:|
| $a^p$ | $a^0$ | $a^p$ |
| $a^p$ | $a^{1/2^k}$ | $a^{p+1/2^k}$ |
| $a^p$ | $a^{2/2^k}$ | $a^{p+2/2^k}$ |
| ⋮ | ⋮ | ⋮ |
| $a^p$ | $a^{i/2^k}$ | $a^{p+i/2^k}$ |
| ⋮ | ⋮ | ⋮ |
| $a^p$ | $a^{(2^k-1)/2^k}$ | $a^{p+(2^k-1)/2^k}$ |
| $a^{p+1}$ | $a^0$ | $a^{p+1}$ |
| $a^{p+1}$ | $a^{1/2^k}$ | $a^{p+1+1/2^k}$ |
| ⋮ | ⋮ | ⋮ |

AMPLIFIED ANALOG INFORMATION READING DEVICE WITH LINEAR DB MODE GAIN CONTROL, IN PARTICULAR FOR AN IMAGE SENSOR

CROSS-REFERENCE TO RELATED APPLICATION

This application is based upon and claims priority from prior French Patent Application No. 04 08357, filed on Jul. 29, 2004, the entire disclosure of which is herein incorporated by reference.

BACKGROUND OF THE INVENTION

1. Field of the Invention

The invention relates to the amplified reading of analog information with linear decibel (dB) mode gain control. It applies advantageously, but not exclusively, to the processing of signals delivered by a pixel matrix of an image sensor.

2. Description of the Related Art

Analog information from the pixel matrix is read by a reading or processing subsystem, including in particular adjustable gain amplification means.

The gain must be defined accurately to take account of the different colors, so as to balance the colors with the requisite accuracy and restore the latter accurately.

Accordingly, there exists a need for overcoming the disadvantages of the prior art as discussed above.

SUMMARY OF THE INVENTION

An object of the invention is to obtain a linear dB mode gain control which is simple to produce.

The invention therefore proposes an amplified analog information reading device with linear decibel mode gain control, comprising:
  an adjustable gain amplification means receiving said analog information and of which the $2^j$ successive gain values, respectively adjustable by $2^j$ successive values of a first control word of j bits, follow a geometric progression of ratio a,
  an analog/digital conversion means connected to the output of the amplification means, having an adjustable input full scale of which the $2^k$ different values, respectively adjustable, for each gain value, from $2^k$ successive values of a second control word of k bits, follow a geometric progression of ratio $a^{1/2^k}$, said conversion means delivering a digital code corresponding to said analog information amplified by an overall gain, the value of which depends on the gain value of the amplifier and on that of said full scale, and
  control means designed to deliver the first and second control words.

The amplifier can thus be used to obtain "rough" gains, the rough gain control being provided in the form of a digital word of j bits.

Moreover, adjustment of the input full scale of the analog/digital converter is used to vary the gain of this analog/digital converter, so as to obtain a fine adjustment of the gain of the reading subsystem.

When the control p (rough gain) is incremented by a unit, the gain, expressed in dB, increases by $20.\log_{10}(a)$. Since the increment in dB is a fixed value, the result is linear dB mode gain.

Similarly, the input full scale is adjusted so as also to have a linear dB mode progression for the fine gain adjustment.

The invention can thus be used to obtain a fine adjustment of the overall gain of the reading subsystem by using only a single amplifier. This is particularly advantageous from the signal-to-noise ratio point of view.

Moreover, the implementation of such a linear dB mode control law, by using a single amplifier and an analog/digital converter, is differentiated from an implementation of such a control law via another means, for example linear dB mode amplifiers known per se, but which are proving to be far less appropriate to the application of an image sensor.

The device advantageously comprises control means delivering a global control word of j+k bits, of which the j high order bits form said first control word and of which the k low order bits form the second control word.

In other words, the user adjusts the total subsystem gain by a digital word of j+k bits, in which the j high order bits determine the rough gain, in which the k low order bits determine the fine gain, and any incrementation of this word of j+k bits results in an increase in the total subsystem gain (expressed in dB) by a fixed value.

According to an embodiment of the invention, the device comprises generation means designed to generate the $2^k$ input full scale values, in response to the second control word of k bits, these generation means including an exponential type analog/digital converter having a multiplexer controllable by said second control word, and a potentiometric divider connected between two terminals respectively receiving full scale maximum and minimum values, and the resistances of which follow a geometric progression of ratio $a^{1/2^k}$.

Moreover, the device advantageously comprises calibration means designed, for each gain value p, to perform a preliminary adjustment of the full scale maximum value Emax,p and of the full scale minimum value Emin,p, such that Emax,p/Emin,p is equal to $a^{1/2^k}$.

The invention also proposes an image sensor including a reading subsystem incorporating an amplified reading device as defined above.

BRIEF DESCRIPTION OF THE DRAWINGS

Other advantages and features of the invention will become apparent on reading the detailed description of embodiments, by no means limiting, and the appended drawings, in which:

FIG. 3 is a table illustrating the trend of the gains obtained by a device according to the invention.

DETAILED DESCRIPTION

Figure 1:
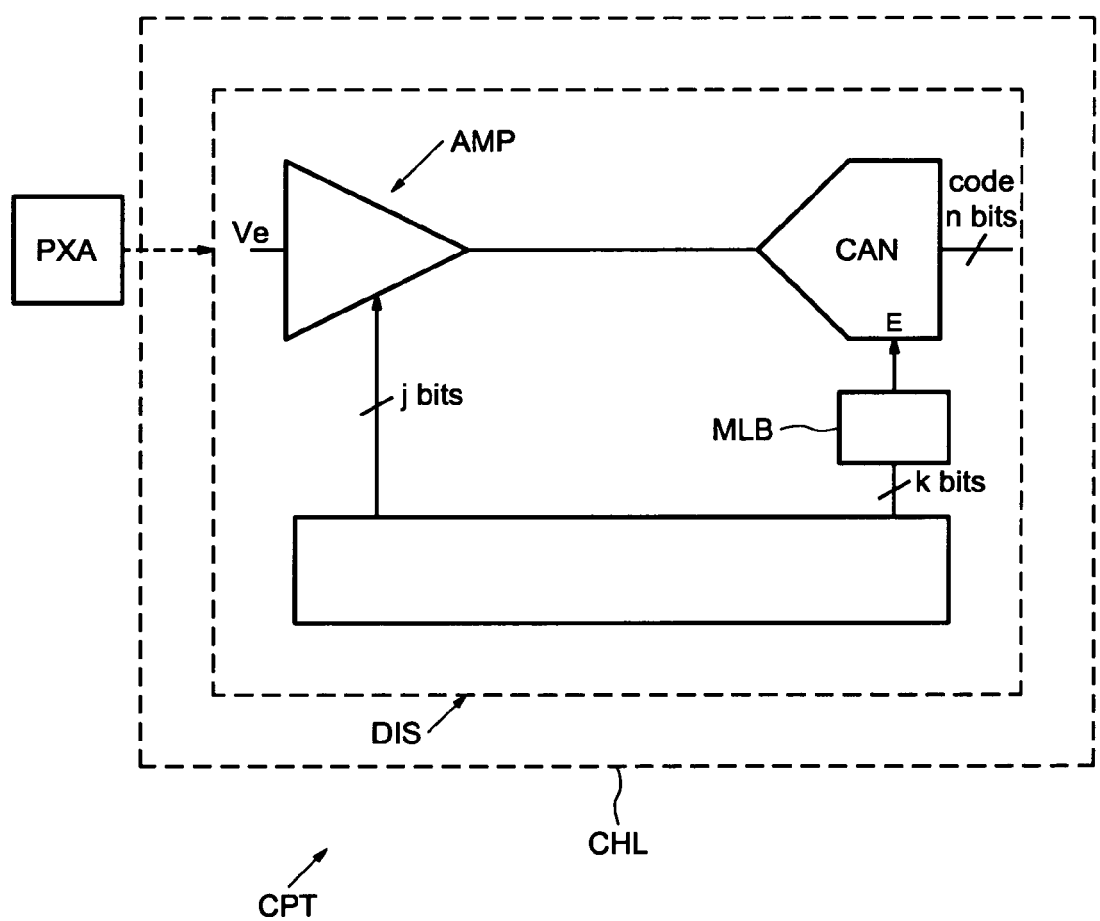
FIG. 1 diagrammatically represents an image sensor according to the invention, in which the reading subsystem incorporates a device according to the invention.

In FIG. 1, the reference CPT denotes an image sensor including in particular a pixel matrix PXA and a reading subsystem CHL incorporating an amplification device DIS according to the invention.

The device DIS includes an adjustable gain amplifier AMP, followed by an analog/digital converter CAN with a resolution of n bits.

Control means MCM deliver a word of j+k bits, in which the j high order bits are used to control the gain of the amplifier AMP. Conventionally, the values of the j bits of the control word are used to switch the transistors on or off to vary the value of the resistive and/or capacitive circuit acting on the gain value of the amplifier AMP.

The gain of the amplifier AMP is expressed by the equation $A=A_0 \cdot a^p$ in which:

$A_0$ is a constant (minimum gain value);

a is a constant greater than 1;

p is the gain control value (control on j bits varying from 0 to $2^j-1$).

Regarding the analog/digital converter, the result of converting an input voltage V is expressed by:

$$Code = V \cdot 2^n / E_i$$

in which $E_i$ is the input full scale of the converter.

The index i corresponds to a control on k bits, therefore varies from 0 to $2^k-1$.

The full scale value $E_i$ is defined by generation means MLB from the k low order bits of the control word delivered by the control means MCM.

The total subsystem gain is therefore: $Gain = A_0 \cdot a^p \cdot 2^n / E_i$ (expressed in quantum per volt terms).

Figure 2:
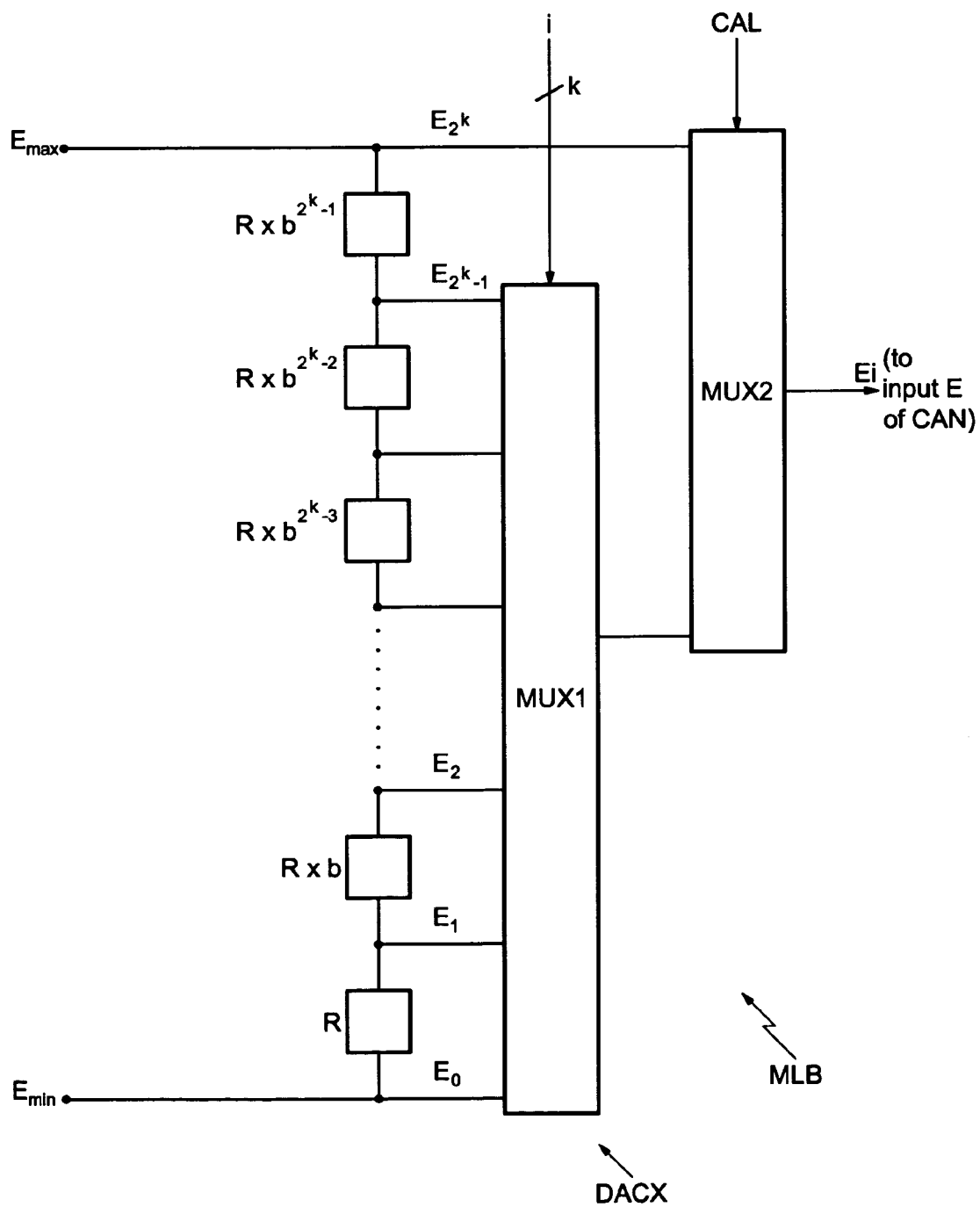
FIG. 2 illustrates in greater detail, but still diagrammatically, a part of the device of FIG. 1.

The $2^k$ separate values of the full scale of the converter CAN, denoted $E_i$, in which i varies from 0 to $2^{k-1}$, are obtained by using an exponential digital/analog converter DACX incorporated in the generation means MLB (FIG. 2).

This exponential digital/analog converter includes a potentiometric divider, the resistances of which follow a geometric progression of ratio b. A multiplexer MUX1 is used to select the corresponding full scale value.

Adjustment of the full scale is used to vary the gain of the analog/digital converter CAN to obtain a fine adjustment of the gain of the reading subsystem CHL. In practice, the range within which the full scale can be adjusted without compromising the performance of the converter is limited. Indeed, this range [$E_{max}$, $E_{min}$] must be such that $E_{max}/E_{min}$ is less than 2. The acceptable ratio of the full scales ($E_{max}/E_{min}$) establishes a maximum limit to the parameter a (ratio of the progression of the amplifier gains).

The ratio b of the geometric progression of the resistances of the potentiometric divider of the exponential digital/analog converter is the unitary subsystem gain increment, in other words that by incrementing the word of j+k bits. It can be computed as follows: bearing in mind that after $2^k$ codes, the rough gain is incremented, the total subsystem gain is multiplied by a. The following therefore applies:

$$b^{2^k} = a$$

or: $b = a^{1/2^k}$

Now, the output code is $$Code = V \cdot 2^n / E_i$$

in which i is the value of the word of k bits. When this word is increased, the code must be multiplied by b, therefore $E_i$ must be divided by b, therefore:

$$E_{i+1} = E_i / b$$

The maximum value of E is $E_{max} = E_0$ (corresponding to the minimum fine gain).

The minimum value of E is $E_{min} = E_{2^k-1}$ (corresponding to the minimum gain).

The potentiometric divider can therefore be used to obtain the ratio b between $E_{i+1}$ and $E_i$.

The rough gain, the fine gain and the total gain of the reading subsystem thus follow a progression partially illustrated in the table of FIG. 3.

When the control p is incremented, the gain—expressed in dB—increases by $20 \cdot \log_{10}(a)$. Since the increment in dB is a fixed value, the term "linear dB mode gain" is used.

Similarly, the full scale is adjusted so as also to have a linear progression in dB for the fine gain adjustment.

When the fine gain control reaches its maximum value (that is, when i equals $2^{k-1}$), the next gain adjustment position of the subsystem is obtained by resetting i=0 and by incrementing the value of p (rough gain control). The gain increase made in this case must be equal to an increase step of the fine adjustment.

Similarly, the user adjusts the total subsystem gain by a binary word of (j+k) bits, in which the j high order bits determine the rough gain, the k low order bits determine the fine gain, and any incrementation of this code of (j+k) bits results in an increase in the total subsystem gain (expressed in dB) by a fixed value.

In practice, the basic increase in the subsystem gain (factor b) is low with respect to the accuracy that can be obtained for the rough gain adjustment (accuracy on the factor a).

Consequently, the increase in the subsystem gain, when p is incremented, cannot be guaranteed by virtue of the production accuracy of the integrated circuit.

It is therefore essential to adjust accurately the values of $E_{max}$ and $E_{min}$ for each value of p. Thus $E_{max,p}$ and $E_{min,p}$ must be adjustable.

These adjustments will be made using two additional digital/analog converters DAC1, DAC2 (FIG. 4), and must be stored on a calibration procedure, prior to using the device.

It is theoretically necessary to adjust $E_{min,p}$ relative to $E_{max,p+1}$ such that $E_{min,p}/E_{max,p+1} = b$.

This operation, which involves amplifying $E_{max,p+1}$ by b, therefore necessitates a high accuracy (b possibly being of the order of +1%, for example). However, the problem can be simplified, as explained below.

In practice, the digital/analog converter delivering the values of E has the necessary accuracy. It is therefore easy to provide an additional output, denoted $E_{2^k}$, which immediately follows $E_{2^k-1}$ in the geometric progression. This position (which can be accessed using the control "CAL") is supposed to provide a gain of the analog/digital converter CAN of value $b^{2^k} = a$. The total subsystem gain is then:

$$a^p \cdot a = a^{p+1}$$

Since the same gain can be obtained by a different control word (p+1 and i=0), the procedure works by searching for a match, which is easier to do than amplification by the factor b.

Figure 4:
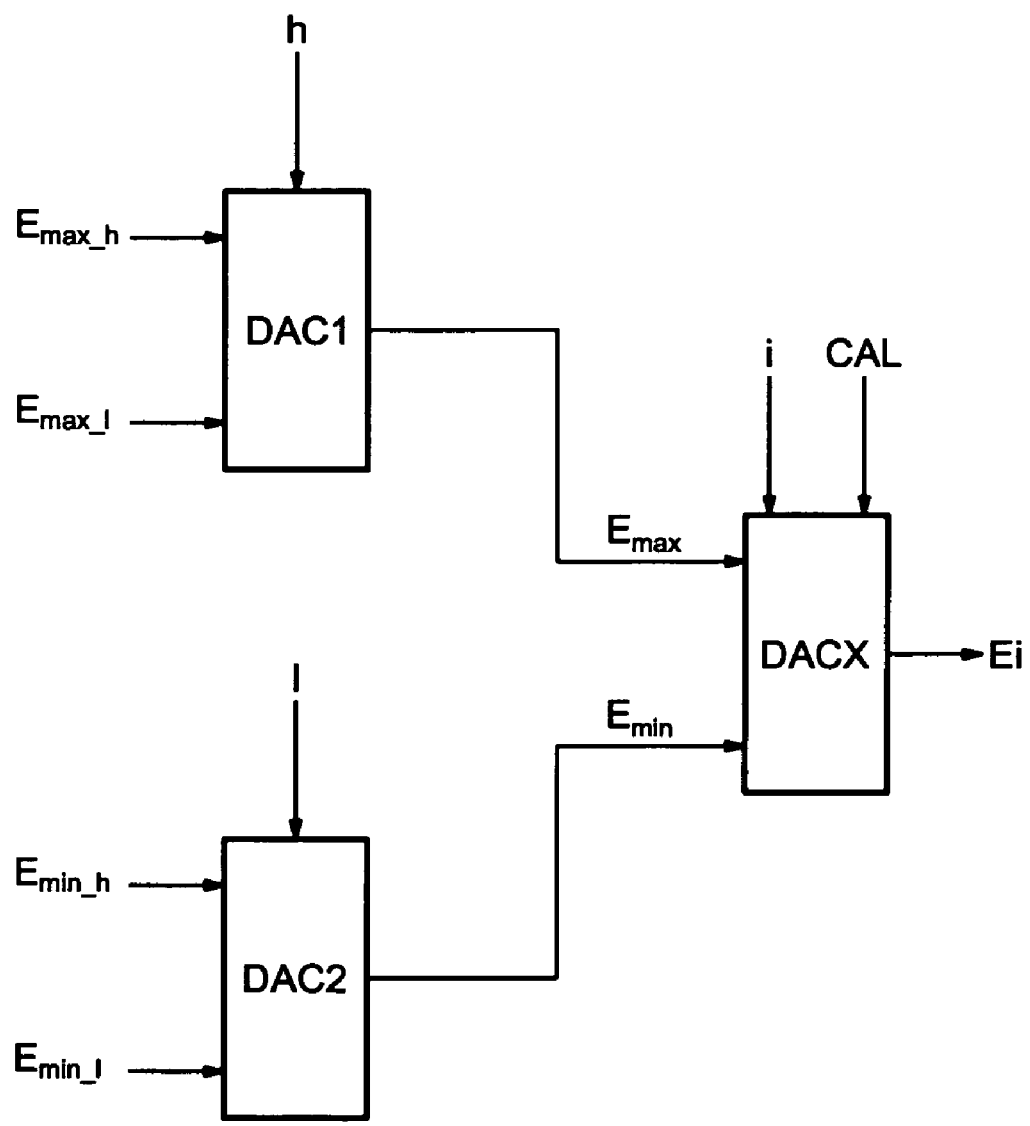
FIGS. 4 and 5 illustrate means for calibrating the device.
Figure 5:
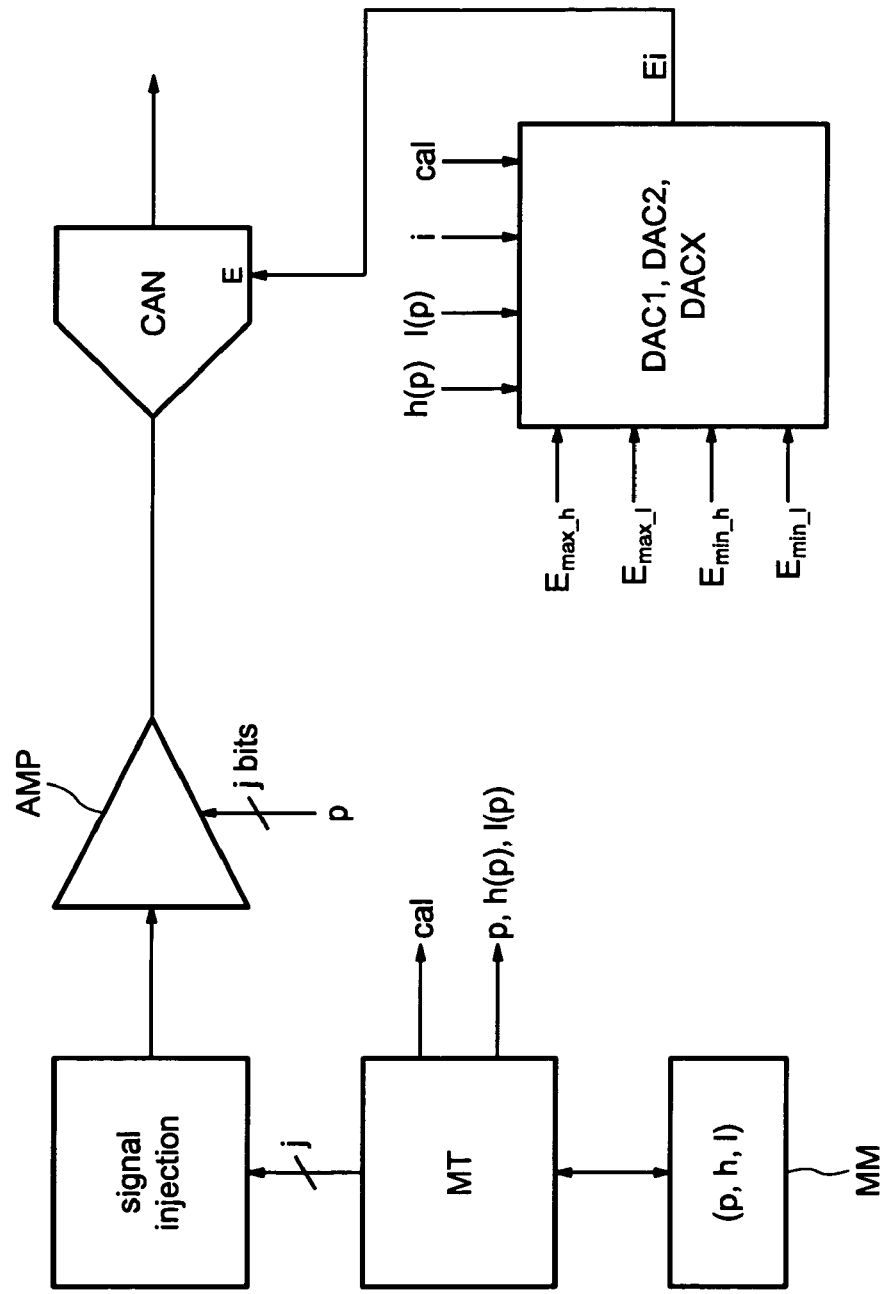

Implementing the calibration procedure requires additional adjustment means (FIGS. 4 and 5).

Thus, in addition to the two digital/analog converters DAC1 and DAC2 for adjusting max and $E_{min}$ at each calibration step, storage means MM are provided to store the settings of these two converters DAC1 and DAC2 corresponding to each value of b (or $2 \times 2^j$ values associated with the $2^j$ values of b).

It is also necessary to provide an additional control (CAL), for accessing an additional output of the digital/analog converter. This additional control is accessible only in calibration mode.

The gain is not a directly accessible quantity, so a calibrated signal must be injected to work on the voltages.

Furthermore, it is essential to take account of the fact that the amplifier has an offset: this is the value of its output when the injected signal is zero.

Since the adjustment consists in searching for a match between two gain positions, it is essential to amplify a calibrated signal in the two agreed positions, and perfect the adjustments of $E_{max}$ and $E_{min}$ so as to obtain identical output codes at the output of the analog/digital converter CAN. This calibration signal must be chosen to produce a sufficiently high voltage (so as not to be limited by the resolution of the analog/digital converter CAN in the case where $E=E_{min}$.

This calibrated signal depends on the subsystem gain (on the control p), and must be such that the output of the amplifier is sufficiently high (so as not be limited by accuracy problems).

It is desirable to work with constant output amplitude at the output of the amplifier. In this case, the signal to be injected must follow a law of the form $1/c^p$, with p varying from 1 to $2^j$.

There are various methods of calibrating the subsystem.

The proposed method makes it possible to ensure that the gain increase is constant across the entire control range of (j+k) bits.

When the amplifier control (code on j bits) is changed, the gain of the latter is normally controlled by a ratio of resistances or capacitances: the absolute accuracy of this control is not necessarily sufficient compared to the fine adjustment.

The method proposed here to calibrate the subsystem is the "straight line regression" method well known per se to those skilled in the art. The implementation algorithm will now be described below and is implanted in processing means MT (FIG. 5):

1. Measure the gains obtained by modifying only the control p of the amplifier ($2^j$ positions). Throughout this operation,
    a) the value of E is held at a typical value $E_{max}$ to obtain the minimum fine gain;
    b) the injected signal keeps a constant minimum value so as never to saturate the analog/digital converter CAN, whatever the gain of the amplifier;
    c) for each value of p, it is also essential to extract the offset by injecting a zero signal.
2. Calculate the gains and convert them to dB.
3. Given that the curve gain_db=f(p) is assumed to be a straight line, compute the straight regression line.
4. For each value of p, and starting from the highest value ($=2^j-1$),
    a. set the gain of the amplifier to $A_0 \cdot a^p$
    b. inject a signal of the form $1/c^p$. (By starting from the highest value of p, it is possible to work back to the case of the minimum injected signal, that is, the case used previously (1.b).
        i. First adjust $E_{min\_p}$ so that the total gain corresponds to the straight regression line. $E_{min\_p}$ is obtained by using i=0.
        ii. Then adjust $E_{max\_p}$ (for this use the control CAL) so that the new gain obtained falls on the straight regression line (theoretical ideal value=gain i obtained with $E_{min\_p}$ divided by b).
        iii. While keeping the same injected signal $1/c^p$, adjust the gain of the amplifier to $A_0 \cdot a^{p-1}$, and adjust $E_{min\_p-1}$ so as to obtain the same subsystem gain as in ii). This is necessary because the two adjustments "ii" and "iii" must give the same gain.
        iv. Decrement p and now inject a signal $1/c^{p+1}$, without changing the gain setting [this gain is therefore that calibrated in iii]. Record the new useful signal obtained.
        v. Loop back to ii, until p=0 is obtained.

On leaving this loop, the gain is calibrated.

The invention can thus be used to produce a total subsystem gain with a single analog stage, so as, on the one hand, to favor the signal-to-noise ratio, and, on the other hand, to limit the consumption. The total subsystem gain can be adjusted with accuracy, typically of the order of 1 to 2% for reconstructing a color image.

The gain of the amplifier is roughly adjustable and the full scale of the analog/digital converter is modulated, so as to obtain a fine linear dB mode adjustment.

This structure is associated with a gain calibration method, so as to ensure uniformity of gain control between the rough adjustment (MSB) and the fine adjustment (LSB).

While there has been illustrated and described what is presently considered to be embodiments of the present invention, it will be understood by those of ordinary skill in the art that various other modifications may be made, and equivalents may be substituted, without departing from the true scope of the present invention.

Additionally, many modifications may be made to adapt a particular situation to the teachings of the present invention without departing from the central inventive concept described herein. Furthermore, an embodiment of the present invention may not include all of the features described above. Therefore, it is intended that the present invention not be limited to the particular embodiments disclosed, but that the invention include all embodiments falling within the scope of the appended claims.

What is claimed is:

1. An amplified analog information reading device with linear decibel mode gain control, comprising:
    an adjustable gain amplification means for receiving said analog information and of which $2^j$ successive gain values, respectively adjustable by $2^j$ successive values of a first control word of j bits, follow a geometric progression of ratio a,
    an analog/digital conversion means, coupled to the output of the amplification means, having an adjustable input full scale of which $2^k$ different values, respectively adjustable, for each gain value, from $2^k$ successive values of a second control word of k bits, follow a geometric progression of ratio $a^{1/2^k}$, said conversion means for delivering a digital code corresponding to said analog information amplified by an overall gain, the value of which depends on the gain value of the amplifier and on that of said full scale, and
    control means for providing the first and second control words.

2. The device according to claim 1, further comprising generation means for generating the $2^k$ input full scale values, in response to the second control word of k bits, the generation means including an exponential type analog/digital converter having a multiplexer controllable by said second control word, and a potentiometric divider connected between two terminals respectively receiving full scale maximum and minimum values, and the resistances of which follow a geometric progression of ratio $a^{1/2^k}$.

3. The device according to claim 1, wherein the control means for delivering a global control word of j+k bits, of which the j high order bits form said first control word and of which the k low order bits form said second control word.

4. The device according to claim 3, further comprising generation means for generating the $2^k$ input full scale values, in response to the second control word of k bits, the generation means including an exponential type analog/digital converter having a multiplexer controllable by said second control word, and a potentiometric divider connected between two terminals respectively receiving full scale maximum and minimum values, and the resistances of which follow a geometric progression of ratio $a^{1/2^k}$.

5. The device according to claim 4, further comprising calibration means for performing, for each gain value p, a preliminary adjustment of the full scale maximum value Emax,p and of the full scale minimum value Emin,p, such that Emax,p/Emin,p is equal to $a^{1/2^k}$.

6. The device according to claim 5, wherein the calibration means for searching for a match between two gain positions respectively obtained with two different control words.

7. The device according to claim 6, wherein, the gains being adjusted to said two gain positions, the calibration means for injecting a calibration signal chosen from these two gain positions, and for adjusting the full scale maximum value and the full scale minimum value so as to obtain identical digital codes.

8. The device according to claim 7, wherein the calibration signal injected follows a law of the form $1/c^p$, p varying from 1 to $2^j$.

9. An image sensor, comprising:
a pixel matrix; and
a reading subsystem incorporating an amplified analog information reading device with linear decibel mode gain control, comprising:
an adjustable gain amplification means for receiving said analog information and of which $2^j$ successive gain values, respectively adjustable by $2^j$ successive values of a first control word of j bits, follow a geometric progression of ratio a,
an analog/digital conversion means, coupled to the output of the amplification means, having an adjustable input full scale of which $2^k$ different values, respectively adjustable, for each gain value, from $2^k$ successive values of a second control word of k bits, follow a geometric progression of ratio $a^{1/2^k}$, said conversion means for delivering a digital code corresponding to said analog information amplified by an overall gain, the value of which depends on the gain value of the amplifier and on that of said full scale, and
control means for providing the first and second control words.

10. The image sensor according to claim 9, further comprising generation means for generating the $2^k$ input full scale values, in response to the second control word of k bits, the generation means including an exponential type analog/digital converter having a multiplexer controllable by said second control word, and a potentiometric divider connected between two terminals respectively receiving full scale maximum and minimum values, and the resistances of which follow a geometric progression of ratio $a^{1/2^k}$.

11. The image sensor according to claim 9, wherein the control means for delivering a global control word of j+k bits, of which the j high order bits form said first control word and of which the k low order bits form said second control word.

12. The image sensor according to claim 11, further comprising generation means for generating the $2^k$ input full scale values, in response to the second control word of k bits, the generation means including an exponential type analog/digital converter having a multiplexer controllable by said second control word, and a potentiometric divider connected between two terminals respectively receiving full scale maximum and minimum values, and the resistances of which follow a geometric progression of ratio $a^{1/2^k}$.

13. The image sensor according to claim 12, further comprising calibration means for performing, for each gain value p, a preliminary adjustment of the full scale maximum value Emax,p and of the full scale minimum value Emin,p, such that Emax,p/Emin,p is equal to $a^{1/2^k}$.

14. The image sensor according to claim 13, wherein the calibration means for searching for a match between two gain positions respectively obtained with two different control words.

15. The device according to claim 14, wherein, the gains being adjusted to said two gain positions, the calibration means for injecting a calibration signal chosen from these two gain positions, and for adjusting the full scale maximum value and the full scale minimum value so as to obtain identical digital codes.

16. The device according to claim 15, wherein the calibration signal injected follows a law of the form $1/c^p$, p varying from 1 to $2^j$.

17. An amplified analog information reading device with linear decibel mode gain control, comprising:
an adjustable gain amplifier receiving the analog information and of which $2^j$ successive gain values, respectively adjustable by $2^j$ successive values of a first control word of j bits, follow a geometric progression of ratio a;
an analog-to-digital converter, coupled to the output of the adjustable gain amplifier, having an adjustable input full scale of which $2^k$ different values, respectively adjustable, for each gain value, from $2^k$ successive values of a second control word of k bits, follow a geometric progression of ratio $a^{1/2^k}$, the analog-to-digital converter delivering a digital code corresponding to the analog information amplified by an overall gain, the value of which depends on the gain value of the amplifier and on that of the full scale; and
a controller for providing the first and second control words.

18. The amplified analog information reading device of claim 17, wherein the controller delivers a global control word of j+k bits, of which the j high order bits form the first control word and of which the k low order bits form the second control word.

* * * * *